United States Patent [19]
LeComte et al.

[11] Patent Number: 5,444,590
[45] Date of Patent: Aug. 22, 1995

[54] SOLID STATE POWER CONTROLLER WITH POWER SWITCH PROTECTION APPARATUS

[75] Inventors: Norman E. LeComte, West Greenwich, R.I.; Sepideh H. Nott, Fall River, Mass.; Keith W. Kawate, Attleboro Falls, Mass.; Thomas R. Maher, Plainville, Mass.

[73] Assignee: Texas Instruments Incorporated, Dallas, Tex.

[21] Appl. No.: 985,411

[22] Filed: Dec. 4, 1992

[51] Int. Cl.⁶ ............................................. H02H 7/10
[52] U.S. Cl. ........................................ 361/18; 361/86; 361/103
[58] Field of Search .......................... 361/103, 18, 86; 363/91, 51, 50

[56] References Cited

U.S. PATENT DOCUMENTS

| | | | |
|---|---|---|---|
| 3,584,261 | 6/1971 | Anderson | 317/132 |
| 3,594,668 | 7/1971 | Clark et al. | 335/13 |
| 3,651,436 | 3/1972 | Cooper et al. | 335/13 |
| 3,944,890 | 3/1976 | Little | 361/96 |
| 4,345,292 | 8/1982 | Jaeschke et al. | 361/94 |
| 4,446,500 | 5/1984 | Grenier et al. | 361/103 |
| 4,814,931 | 3/1989 | Kugelman et al. | 361/56 |
| 4,866,559 | 9/1989 | Cobb et al. | 361/103 |
| 4,979,066 | 12/1990 | Kawata et al. | 361/18 |

FOREIGN PATENT DOCUMENTS
4106690 9/1992 Germany.

*Primary Examiner*—Todd DeBoer
*Attorney, Agent, or Firm*—Russell E. Baumann; Richard L. Donaldson; René E. Grossman

[57] ABSTRACT

A solid state power controller for switching power on and off to an electrical load which also serves as a circuit protection device protecting the load and/or the wire connected between the load output terminal of the controller and ground from thermal damage due to current overload is shown. When a current overload exists the controller interrupts current to the load in a time inversely proportional to the square of the magnitude of the overload as shown in a trip time vs load current curve. The controller also limits the load current to a selected maximum level by controlling the drain-source resistance of power MOSFETs used for switching the power. A secondary interrupt is provided in the event that the junction temperature of the MOSFETs has risen a selected maximum level. A thermal memory feature is included for both interrupt signals. The controller is controlled by a single on/off input line and provides both a status and trip output line to indicate its state. The status can be configured to monitor load voltage or load current flow as desired. The controller also can be configured to default to either an on or off state in the event the input line is disconnected.

16 Claims, 5 Drawing Sheets

SOLID STATE POWER CONTROLLER WITH POWER SWITCH PROTECTION APPARATUS

BACKGROUND OF THE INVENTION

Application Ser. No. 07/985,406 filed of even date herewith and assigned to the same assignee as the instant invention and this application relate to the same subject matter.

This invention relates generally to a solid state circuit controller and more specifically to a solid state circuit controller for switching power to a load and for protecting the switch from damage due to power dissipation.

In copending application, Ser. No. 07/985,406, assigned to the assignee of the present invention, a solid state circuit controller is described and claimed which has utility in many applications, such as, by way of example, in aircraft power distribution systems.

In the controller described in that application an analog voltage is produced proportional to a wire or load temperature rise or energy equation which produces a trip signal when the maximum temperature rise of the wire, simulated by a reference voltage, is reached. The section comprises a linear circuit which measures the current flow through the wire, calculates its heating impact on the wire and provides a signal to trip the controller when the wire temperature has risen its maximum safe level as defined by a selected curve set such as one derived from the MS3320 trip time vs load current curves. The circuit reads the current in the wire as a voltage signal across a shunt resistor serially connected to the wire, a signal is scaled by an amplifier stage, squared with the resultant applied to an RC network. The output voltage from the RC network is monitored by a comparator which has a threshold set by the referenced voltage according to an energy equation. When the output voltage of the RC network reaches the threshold level the comparator output transitions to an opposite state signaling the Logic section of a trip condition in order to interrupt current flow within the wire by turning off solid state switch means connected to the wire, e.g., one or more MOSFETs.

It is an object of the present invention to provide protection of such MOSFETs from thermal damage due to power dissipation. Another object is the provision of controller apparatus for supplying a selected level of current to a load. Yet another object is to provide apparatus to protect solid state power switches used both to limit current flow therethrough, and to switch high voltage DC, from thermal damage from power dissipated in the switches.

Various other objects and advantages will appear from the following description of an embodiment of the invention and the novel features will be particularly pointed out hereinafter in connection with the accompanying drawings and the appended claims.

SUMMARY OF THE INVENTION

Briefly, in accordance with the present invention, there is provided a controller having a MOSFET Drive and Current Limiting section which turns MOSFETs on and off by supplying and removing, respectively, MOSFET gate charge and limits current flow through the MOSFETs to a predetermined level by decreasing and increasing the MOSFETs on resistance through gate charge addition and removal, respectively. The apparatus also includes including a MOSFET Protection section which produces an analog voltage proportional to the MOSFET temperature rise and provides a trip signal when the allowable temperature rise of the MOSFETs, simulated by a reference voltage, is reached in order to protect the MOSFETs from thermal damage caused by high power dissipation.

According to a feature of the invention a current is generated proportional to the voltage drop across the MOSFET which is converted to a first electrical signal proportional to the power dissipated in the MOSFET. This signal is integrated as a function of time providing a second signal proportional to the temperature rise of the junction of the MOSFET and a trip signal is generated when the preselected allowable temperature rise of the junction has been reached.

DESCRIPTION OF THE PREFERRED EMBODIMENTS

Figure 1:
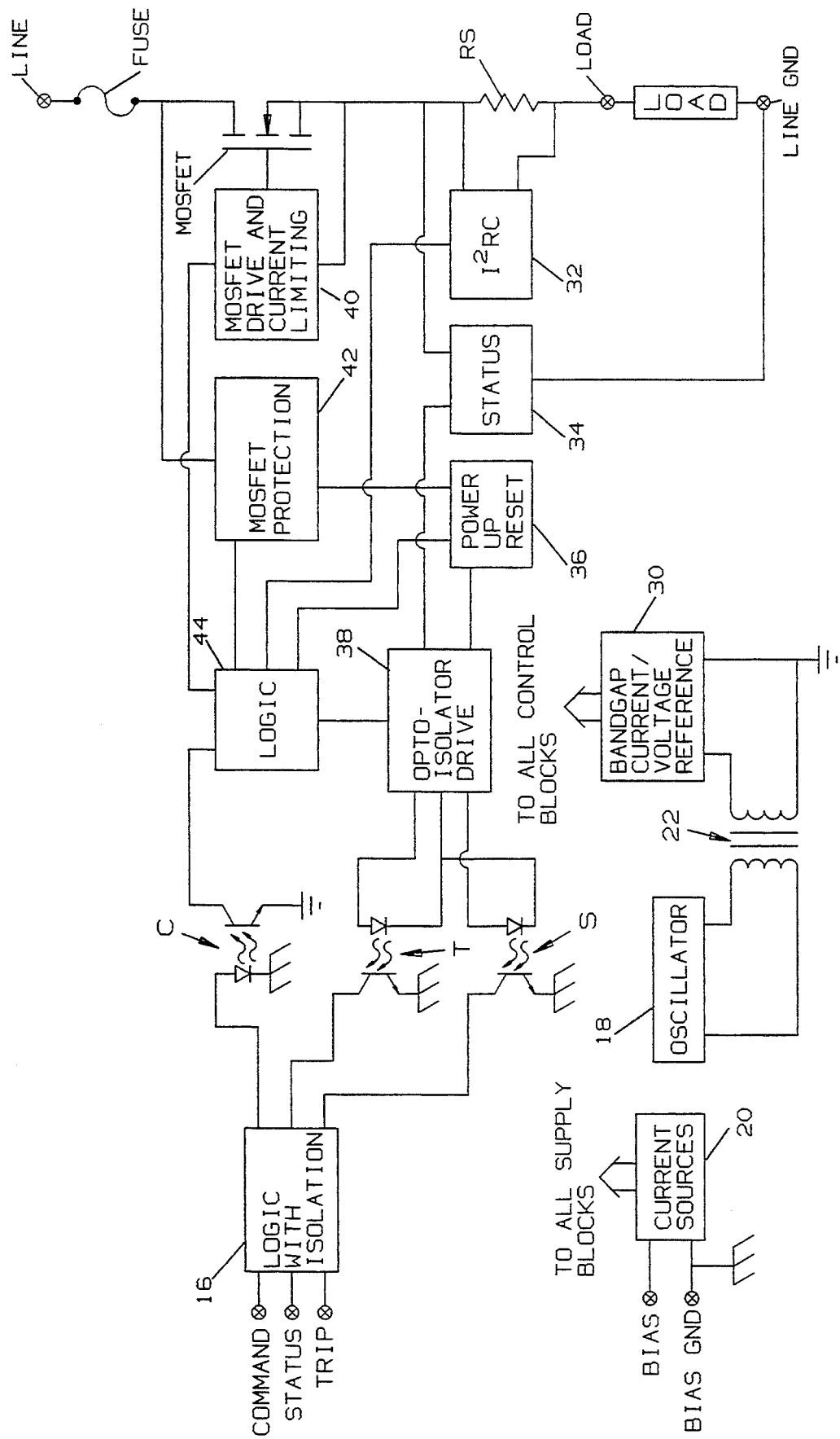
FIG. 1 is a block diagram of a solid state circuit controller made in accordance with the invention.

With particular reference to FIG. 1 the controller comprises a first supply portion which includes the functional blocks Logic With Isolation section 16, Oscillator section 18 and Current Sources section 20. A second control portion of the controller includes a MOSFET Drive and Current Limiting section 40, a MOSFET protection section 42, $I^2RC$ section 32, Logic section 44, Status section 34, Band Gap Current/Voltage section 30, Opto-Isolator Drive section 38 and a Power-up Reset section 36.

With reference to the following description it should be noted that all current sources are non-ideal. They are only functional provided the negative terminal of the current source is approximately one diode voltage drop above the positive terminal. If there is less than one diode drop, the output current is effectively zero. Unless otherwise noted, the outputs of each logic gate and comparator is an open collector transistor (NPN), therefore a logic low voltage is equal to the saturation voltage of the output transistor (approximately 0.2 V). The inputs of all logic gates are non-ideal current sources, therefore, due to the non-ideal behavior of the current sources a logic high voltage is equal to the voltage at the negative terminal of the current source minus one diode voltage drop. Unless otherwise stated, all voltages within an ASIC are referenced to the local or individual ASIC ground. The stated voltages are assumed to be nominal.

Figure 2:
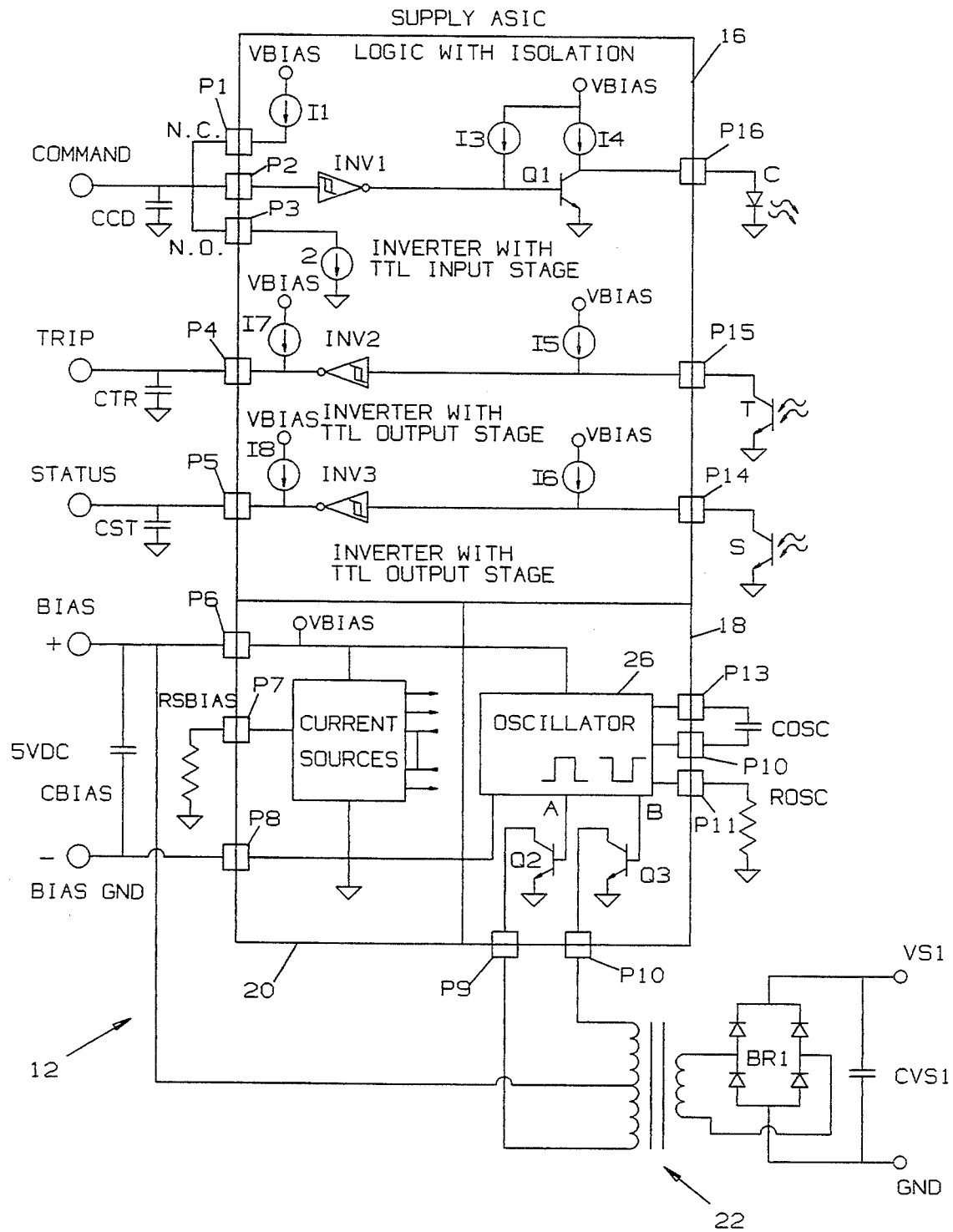
FIG. 2 is a circuit diagram showing a Supply ASIC and associated externally mounted components used with the present invention.
Figure 3A:
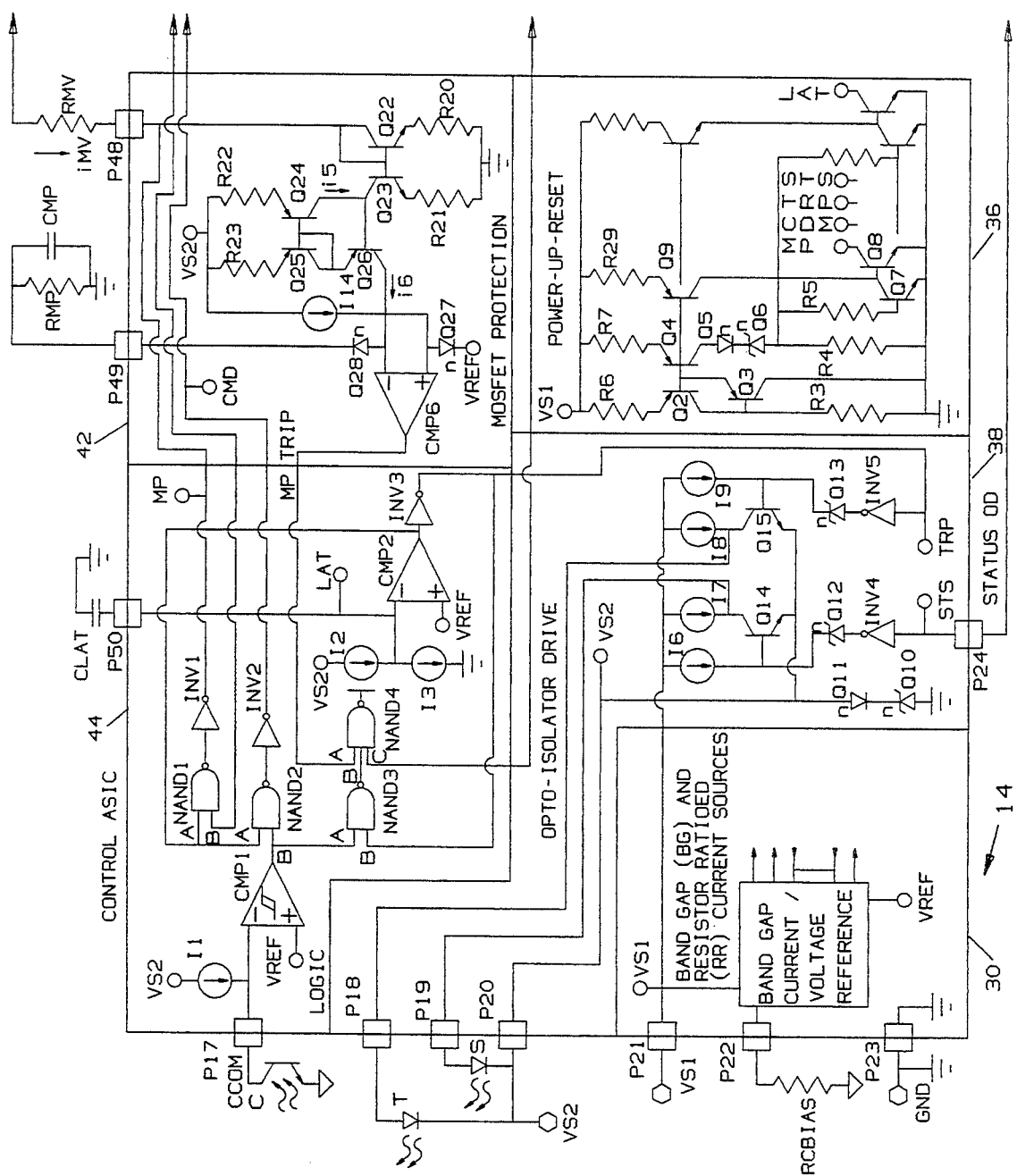
FIGS. 3a and 3b are first and second portions respectively of a circuit diagram showing the Control ASIC and associated externally mounted components used with the present invention.
Figure 3B:
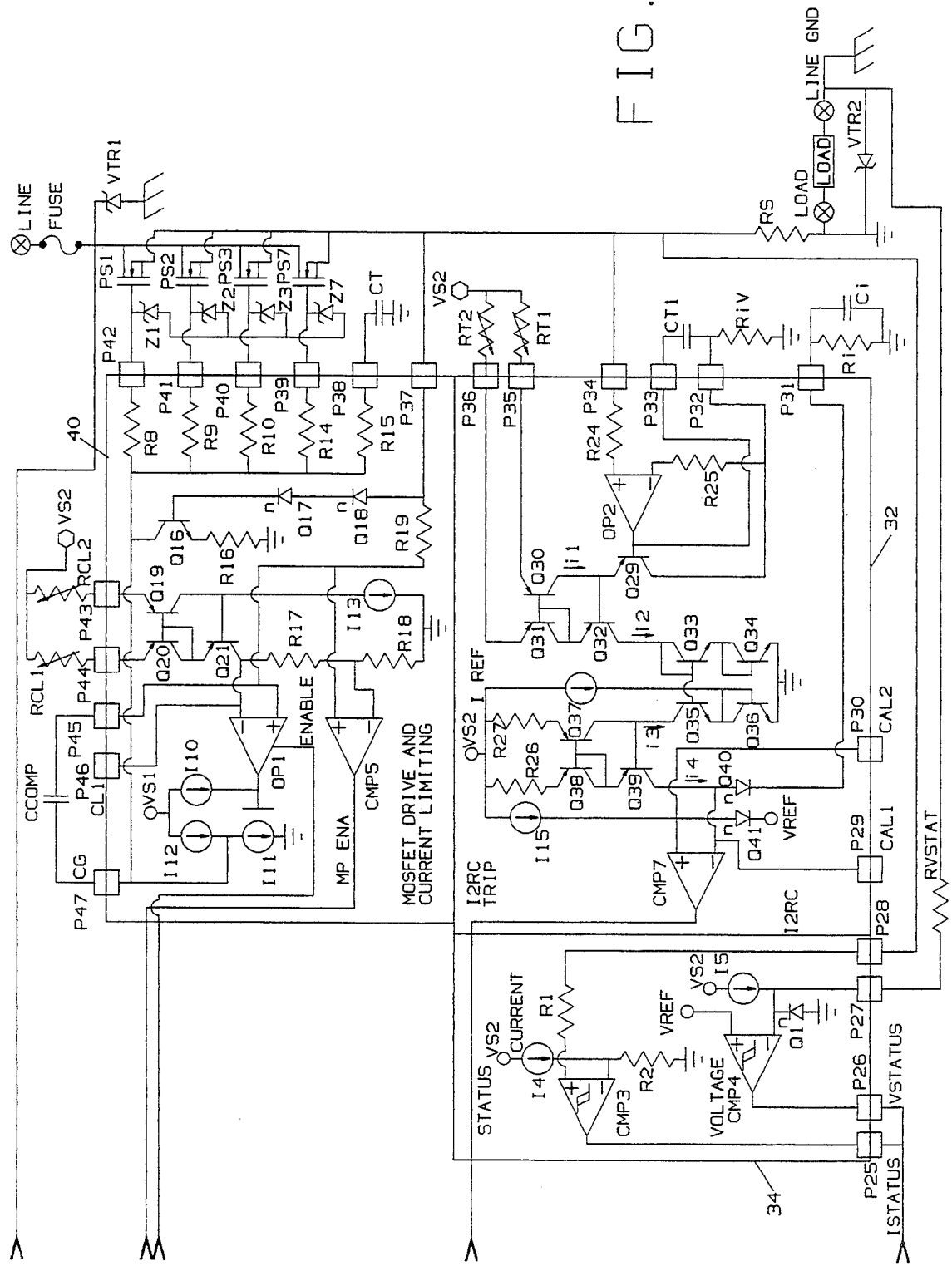
Figure 3C:
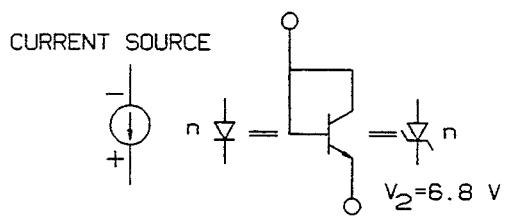
FIGS. 3c-3f several conventional symbols and their equivalents.
Figure 3D:
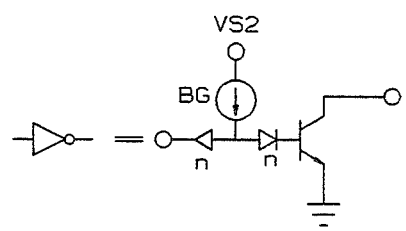
Figure 3E:
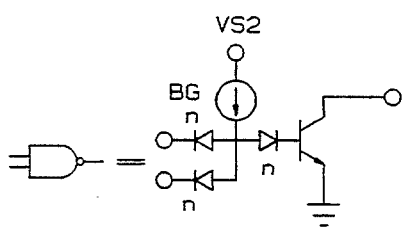
Figure 3F:
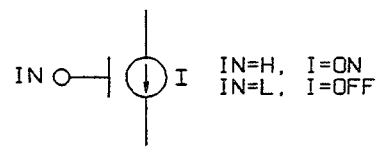

According to a preferred embodiment of the invention, as seen in FIGS. 2 and 3, a controller comprises two integrated circuits referred to as Supply ASIC 12 and Control ASIC 14 and various discrete external components.

As seen in FIG. 2, the supply circuitry is made up of Supply ASIC 12 and various externally mounted components including capacitors, resistors, photo transistors/LEDs, transformers and diode bridges. Supply ASIC 12 is made up of functional sections Logic With Isolation 16, Oscillator 18 and Current Sources 20.

The function of Logic With Isolation section 16 is to provide a TTL compatible input stage for a COMMAND line, an LED driver for the COMMAND line opto-isolator C, a TTL compatible output stage for STATUS and TRIP lines, and a photo-transistor receiver for STATUS and TRIP line opto-isolators S and T, respectively. All control signals communicated between ASICS 12 and 14 are passed through opto-isolators to achieve isolation between the two circuits.

TTL input/output standards are as follows:

| Input | |
|---|---|
| TTL logic high input voltage | 2.0V maximum |
| TTL logic low input voltage | 0.8V minimum |
| TTL logic high input current | 20 uA maximum |
| TTL logic low output current | 400 uA maximum |
| Output | |
| TTL logic high output voltage | 2.4V minimum |
| TTL logic low output voltage | 0.4V maximum |
| TTL logic high output current | 400 uA minimum |
| TTL logic low input current | 8 mA minimum |

The COMMAND input line is tied to an externally mounted filter capacitor Ccd to protect against transient damage to ASIC and connected to the input of inverter INV1 having hysteresis to improve noise immunity of the circuit. Depending on the particular load with which the controller is to be used, by tying either the normally closed current source I1 of 10u A or the nominally open current source I2 of 10u A pin to the COMMAND pin, the input of INV1 will be pulled high (one diode drop below BIAS) or low (one diode drop above BIAS GND), respectively in the event the COMMAND line is open circuited, i.e., disconnected.

Current sources I3 and I4 are connected to the base and collector respectively of transistor Q1 whose collector is also connected to opto-isolator C. When the input of inverter INV1 is low the output of inverter INV1 is an open collector NPN transistor and I3 of 200u A supplies base current to transistor Q1. Transistor Q1 is saturated with a collector current of 2m A supplied by I4, therefore no current flows through the LED of the COMMAND opto-isolator C and the LED is off.

When the input of inverter INV1 is high, the output of inverter INV1 is low, a saturated NPN transistor with 200u A current source from I3, and transistor Q1 is off (open collector) so that source I4 supplies current to the LED of the COMMAND opto-isolator C turning the LED on.

Inverters INV2 and INV3 both have input stages incorporating hysteresis to improve the noise immunity of the circuits. Externally mounted capacitor $C_{tr}$ and $C_{st}$ are tied to the TRIP and STATUS outputs respectively to protect against transient damage to the ASIC 12.

When the state of the photo-transistor of the TRIP opto-isolator T is open collector (LED off), the input of inverter INV2 is pulled above the upper threshold by I5 (200u A) and the output of inverter INV2 goes low, a saturated NPN transistor, signifying no trip condition. When the photo-transistor of the TRIP opto-isolator T is saturated (LED on) the input of inverter INV2 is below the lower threshold and the output of inverter INV2 is an open collector NPN transistor and is pulled high by I8 of 800u A signifying a trip condition.

In like manner, when the state of the photo-transistor of the STATUS opto-isolator S is an open collector (LED off), the input of inverter INV3 is pulled above the upper threshold by current source I6 (200u A) and the output of inverter INV3 goes low, a saturated NPN transistor, signifying no status condition. When the photo-transistor of the STATUS opto-isolator is saturated (LED on), the input of inverter INV3 is below the lower threshold and the output of INV3 is an open collector NPN transistor and is pulled high by I7 of 800u A signifying a status condition.

The function of the oscillator section 18 is to produce a transformer drive signal which is used to power ASIC 14, the controller circuitry, by means of an isolation transformer 22, a full wave bridge BR1 and a smoothing capacitor $C_{vs1}$.

Oscillator 26 is a standard emitter-coupled oscillator modified with high speed output comparators to drive transistors Q2 and Q3. The oscillator frequency is set by capacitor $C_{osc}$ and resistor $R_{osc}$ mounted externally of the ASIC. Oscillator 26 produces two output signals, A and B, which are 250 KHZ square waves 180° out of phase with each other. The oscillator outputs drive transistors Q2 and Q3 into saturation when high; the transistors having an open collector when low. The collector of transistors Q2 and Q3 are tied to the ends of the primary winding of transformer 22 whose center tap is connected to the BIAS line. Driven by transistors Q2 and Q3 the transformer acts as two synchronized 1:4 ratio transformers (1/2:2 primary to secondary ratio). With practical transformer efficiencies, saturation voltages of transistors Q2 and Q3 equal to 0.2 V and a BIAS voltage of 5 V, a 16.5 V peak to peak square wave is produced across the transformer secondary. A full wave rectifier BR1 is placed across the transformer secondary to create a DC output of 15.1 V. A capacitor $C_{vs1}$ is placed across the DC outputs of the rectifier to smooth the output which is connected across VS1 and GND to power the control circuitry of ASIC 14.

The function of the Current Sources section 20 is to provide temperature stable current sources to power other sections of the ASIC. The reference current level used to derive all other current sources is set by externally connected resistor $R_{sbias}$. The current sources section 20 and other functional sections of ASIC 12 operate at a nominal voltage level of 5 V. Externally mounted capacitor $C_{bias}$ is added across the BIAS and BIAS GND lines to minimize noise generated by the switching of the functional blocks of ASIC 12 and to protect against transient damage to ASIC 12.

The function of the control circuitry is to, a) turn the load current on and off by means of a solid state switch made up of MOSFETs in response to a $C_{com}$ input from ASIC 12, b) provide a primary trip mechanism to remove load current from the load in accordance with a selected trip time vs load current curve, c) limit the maximum load current to a predetermined calibrated level (current limit), d) provide a secondary trip mechanism that protects the MOSFETs from damage when in the current limiting mode, e) provide a trip latching feature which holds a trip, keeping the controller off until reset by the $C_{com}$ input from ASIC 12, f) provide the required drive signal for an opto-isolator LED to communicate a status indication to ASIC 12 reflecting that either load voltage or load current above a specified threshold is present, and g) provide the required drive signal for an opto-isolator LED to communicate a trip indication to ASIC 12.

As seen in FIG. 3, the control circuitry is made up of Control ASIC 14 and various externally mounted components including resistors, capacitors, photo-transistors/LEDs, MOSFETs and semiconductor transient suppressors. Control ASIC 14 comprises the following functional sections: Band Gap Current/Voltage Reference section 30, I²RC section 32, Status section 34, Power-Up-Reset section 36, Opto-Isolator Reference Drive section 38, MOSFET Drive and Current Limiting section 40, MOSFET Protection section 42 and Logic section 44.

Band Gap Current/Voltage Reference section 30 provides a temperature stable voltage reference, temperature stable current sources and resistor ratioed current sources used by other functional sections within ASIC 14.

$V_{ref}$, the band gap voltage reference, is derived from a standard band gap reference circuit which creates an inherently temperature stable voltage of approximately 1.25 V which is scaled up using internal resistor ratioing to obtain $V_{ref}$ of 3.25 V which serves as a reference voltage for other functional blocks of ASIC 14. $V_{ref}$ is also used in conjunction with $R_{cbias}$ to create temperature stable band gap, BG, current sources used to power other functional blocks within ASIC 14. Resistor ratioed, RR, current sources are also developed within this section whose values are ratioed by internal ASIC resistors to create temperature stable voltage references of values other than $V_{ref}$, needed by other functional sections of ASIC 14, by feeding the RR current sources through internal ASIC resistors matched with those used to establish the value of the RR current sources.

I²RC circuit 32 creates an electronic analog of the temperature of a wire as a function of the heating due to current flow through the wire and outputs a trip signal indicating that the temperature of the wire has risen a predetermined amount, simulating a selected trip time vs load current curve. In addition, circuit 32 provides a feature known as "thermal memory". Thermal memory is a term which refers to the feature of shortening the trip time of a given load current level due to previously stored energy in the wire, or equivalently elevated initial wire temperature, as a result of previous load current flow. Without this feature, trip times for a given load current level would remain constant and repeated applications of load current at intervals which did not allow the wire temperature to return to ambient would cause the wire to exceed the maximum specified level.

A thermal model of the wire can be used to determine the time required for a given amount of power dissipation to raise the wire temperature a selected amount. The following first order differential equation models the energy stored in the wire as a function of time ($E_w(t)$) which is proportional to the temperature rise of the wire as a function of time:

$$K\ E_w(t) + d\ E_w(t) = R_w\ I_w^2(t) \quad (1)$$

Where:
$R_w$ resistance of the wire.
$I_w(t)$ current through the wire as a function of time.
$R_w I_w^2(t)$ power dissipated within the wire
$K$ 1/the thermal time constant of the wire.
The solution is as follows:

$$E_W(t) = \int_0^t R_W I_W^2(\tau) e^{-K(t-\tau)} d\tau + E_W(t=0) e^{-Kt} \quad (2)$$

Where:
$E_w(t=0)e^{-Kt}$ the thermal memory of the equation where $E_w(t=0)$ is the energy stored in the wire at time=0.

The I²RC circuit section 32 simulates the temperature rise of the wire and produces a trip signal when the temperature of the wire has risen a specified amount. Circuit 32 produces an electrical signal in the form of voltage which is proportional to the above energy/temperature equation in the manner described below.

Load current $I_w(t)$ flowing through shunt $R_s$ causes a voltage to be developed across shunt $R_S$ as follows:

$$V_s(t) = I_w(t)\ R_s \quad (3)$$

The non-inverting terminal of ground sensing op-amp OP2 is tied to the positive connection of shunt RS through resistor R24 of 600 ohms. The output of op-amp OP2 is connected to the base of NPN transistor Q29 and to ground through stabilizing capacitor $C_{t1}$ and serially connected resistor $R_{iv}$. The emitter of transistor Q29 is tied to the junction of capacitor $C_{t1}$ and resistor $R_{iv}$ and to the inverting terminal of op-amp OP2 through resistor R25 of 600 ohms. This arrangement in the feedback path of the op-amp OP2 forces the voltage of the inverting terminal of op-amp OP2 to equal the voltage at its non-inverting terminal, i.e., $R_s$ voltage. Assuming negligible base current flowing at transistor Q29:

$$i1(t) = V_s(t)/R_{iv} = I_w(t)\ R_s/R_{iv} \quad (4)$$

Transistors Q30, Q31 and Q32 make up a standard "Wilson" current mirror configuration providing improved collector current matching by minimizing base current error. Externally mounted emitter resistors $R_t1$ and $R_t2$ for transistors Q30 and Q31 respectively provide a means for external calibration of current i2(t). That is, $$i2(t) = i1(t)\ R_t1/R_t2 = I_w(t)\ R_s R_t1/(R_{iv}\ R_t2) \quad (5)$$

Calibration of current i2(t) provides a means of adjusting the ultimate trip of the controller trip time vs load current curve in a highly accurate, quick manner and at low cost. Ultimate trip calibration is performed by disconnecting capacitor $C_i$, to be discussed below, from the circuit to make the time constant of the circuit equal to 0, running the selected ultimate trip current through the controller, and trimming resistors $R_t1$ and $R_t2$ until the voltage difference between pins $C_{al}1$ and $C_{al}2$ (P29, P30), connected respectively to the inverting and non-inverting inputs of comparator CMP7, is 0 V. Capacitor $C_i$ is then connected to complete the circuit.

Due to the fact that resistor trimming procedures such as laser trimming, only increases the value of a resistor, two resistors are needed to adjust current i2(t). Increasing the value of $R_t1$ tied to transistor Q30 will increase i2(t) whereas increasing the value of $R_t2$ tied to transistor Q31 will decrease the value of current i2(t).

NPN transistors Q33, Q34, Q35, Q36 and current source $I_{ref}$, a band gap current source of 300u A, form an approximate current squaring function as follows:

$$i3(t) = i2^2(t)/I_{ref} = I_w^2(t) \, (R_s \, R_t 1/(R_{iv} \, R_t 2))^2/I_{ref} = I_w^2(t) \, Y \text{ where } Y = (R_s \, R_t 1/(R_{iv} \, R_t 2))^2/I_{ref} \quad (6)$$

The current to be squared, i2, is fed into diode connected transistors Q33, Q34. Transistor Q36 is fed by a relatively large current source $I_{ref}$ (300u A). As a result of the large current source ($I_{ref}$) relative to i3 the diode drop across transistor Q36 is essentially constant and the total of the two $V_{bes}$ built-up across transistors Q33, Q34 is imposed across the base-emitter of transistor Q35 thereby squaring the Q33, Q34 collector current.

Transistors Q37, Q38, Q39 and resistors R26 and R27 form a standard Wilson current mirror configuration providing improved collector current matching by minimizing base current error with emitter resistors to minimize errors due to transistor $V_{be}$ mismatch resulting in:

$$i4(t) = i3(t) \quad (7)$$

Current i4(t) flows through diode connected NPN transistor Q40 to charge the parallel R-C network made-up of resistor $R_i$ and capacitor $C_i$. The voltage across resistor Ri and capacitor $C_i$ is as follows:

$$V_W(t) = 1/C_i \int_0^t I4(\tau)e^{-1/(R_iC_i)(t-\tau)}d\tau + V_W(t=0)e^{-t/(R_iC_i)} \quad (8)$$

$$V_W(t) = 1/C_i \int_0^t YI_W^2(\tau)e^{-1/(R_iC_i)(t-\tau)}d\tau + V_W(t=0)e^{-t/(R_iC_i)} \quad (9)$$

By comparing the equations for $E_w(t)$, No. 2, and $V_w(t)$, Nos. 8 or 9, it can be seen that the two are proportional under the following conditions:

$R_i \, C_i = 1/K$, setting the time constants of the two equations equal to each other, I4(t) is proportional to $I_w^2(t)$ as shown previously by equation Nos. 6 and 7, and $1/C_i * Y$ (constant) is chosen to be the right proportion to $R_w$.

By way of example, let $I_w(t)$ be a step function ($I_w(t-) = I_w$ for t>0, $I_w(t) = 0$ for t<0) and $V_w(t=0) = 0$, then the solution for $V_w(t)$ is:

$$V_w(t) = Y/C_i \, I_w (1 - e^{-t/R_i \, C_i}) \quad (10)$$

Figure 4:
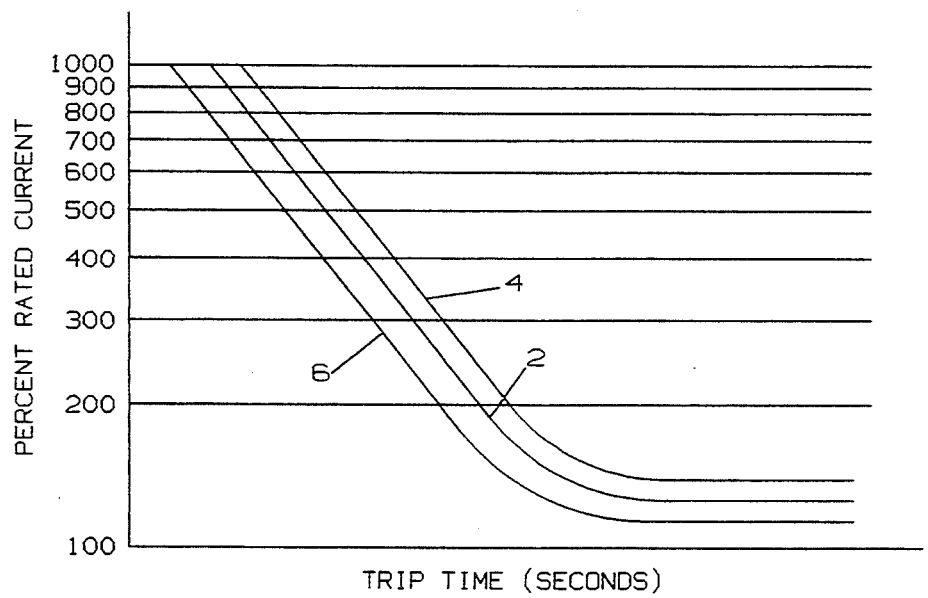
FIG. 4 is a trip time vs load current curve as used in accordance with the present invention.

It may be noted that this equation is used to develop the FIG. 4 curve.

Diode connected transistor Q40 is connected to the RC network $R_i C_i$ to prevent discharge of the RC network through other circuitry such as comparator CMP7, preserving thermal memory even when power is removed, thereby providing the same memory function as an electromechanical thermal circuit breaker.

Diode connector transistor Q41 connected between $V_{ref}$ derived from the Current/Voltage Circuit 30 and the non-inverting input of comparator CMP7 provides compensation for the temperature effect on the voltage drop across transistor Q40.

The voltage at the inverting terminal of CMP7 ($V_{cmp}$ 7−) is equal to:

$V_{cmp}7- = V_w(t) + V \, Q40$, where VQ40 is the voltage drop across Q40.

The voltage at the non-inverting terminal of CMP7($V_{cmp}$ 7+) is equal to:

$V_{cmp}7+ = V_{ref} + VQ41$, where VQ41 is the voltage drop across Q41. Diode Q41 is forward biased by current source I15.

Assuming that the difference between the voltage drop across VQ40 and VQ41 is negligible, when $V_w(t)$ is less than $V_{ref}$ then $V_{cmp}$ 7− will be less than $V_{cmp}$ 7+ and the output of comparator CMP7 will be high signifying that the wire temperature has not risen above the selected amount and therefore, a trip condition is not present.

Again, assuming that the difference between the voltage drop across VQ40 and VQ41 is negligible, when $V_w(t)$ is greater than $V_{ref}$, $V_{cmp}$ 7− will be greater than $V_{cmp}$ 7+ and the output of comparator CMP7 will be low signifying that the temperature of the wire has risen the selected amount and that a trip condition is present. The output of comparator CMP7 is tied to input C of NAND gate NAND 4 through line $I^2RC$ TRIP.

As an example, external component values used to achieve a trip time vs load current curve 2 per MS3320 seen in FIG. 4 are as follows:

$R_s = 10m$ ohm (10.0 amp rated load current)
$R_{iv} = 15.8K$ ohm
$C_t = 1000$ pF
$R_i = 15.1M$ ohm
$C_i = 1$ uF
$R_t 1$ and $R_t 2 =$ Adjusted to set the nominal ultimate trip load current percentage (126.5 of rated current). Approximate value for each of $R_t 1$ and $R_t 2$ is 20K ohms.

Dashed line curves 4 and 6 shown in FIG. 4 represent maximum and minimum trip time vs load current curves, respectively.

Using the $V_w(t)$ equation (Nos. 8 or 9) it can be seen that adjusting one or more of the external components of circuit 32 can tailor the circuit performance to meet specific requirements of a given application. The current performance characteristics which can be changed by adjusting one or more external components are the trip time vs load current curve time constant, load current rating (i.e., 2.5 amp, 5.0 amp, 10.0 amp, etc.) and ultimate trip load current. For example, for a given load current rating, other trip time vs load current curve time constants can be obtained by adjusting capacitor $C_i$ and resistor $R_i$, for a given trip time vs load current curve time constant, other load current ratings can be used by adjusting $R_s$, the ultimate trip load current can be adjusted by resistors $R_t 1$, $R_t 2$ and $R_{iv}$.

Preferably, the resistance of the shunt $R_s$ has been chosen such that 100% rated current, RI, produces 100m V across the shunt (100 m V/100% rated current), i.e., a controller with a rated current of 10A would use a 10 m ohm shunt. By choosing the shunt in this way, the voltage produced across the shunt for a given rated current percentage will be the same independently of the rated current value, e.g., x % of R I = x mV across $R_s$. However, if desired, other shunt resistances providing other scale factors may be chosen.

The function of Status circuit 34 is to provide an output of either a selected current or a voltage status indication when the load current or load voltage, respectively, exceeds a predetermined threshold. Current status indication is chosen by connecting pin P25 to pin P24 whereas voltage status is chosen by connecting pin P26 to pin P24. With respect to the current status, an 18 mV reference voltage tied to the inverting terminal of the ground sensing comparator CMP3 is set by resistor ratio current source I4 of 30u A and a 600 ohm resistor R2. Comparator CMP3 is designed to have approximately 4 mV of hysteresis to enhance noise immunity of the circuit. The non-inverting terminal of comparator CMP3 is tied to resistor $R_s$ through 600 ohm resistor R1. When the voltage across shunt $R_s$ is less than the lower threshold of CMP3 (18 mV) the output of the comparator tied to the ISTATUS pin P25 is low and when the voltage across shunt $R_s$ exceeds the upper threshold (22 mV) the output is high.

With respect to the voltage status the inverting pin of comparator CMP4 is connected to the positive terminal of band gap current source I5 of 50 u A, to the cathode of diode connected NPN transistor Q1 and through pin P27 to $R_{vstat}$ and then to LINE GND. The non-inverting terminal of comparator CMP4 is tied to a voltage reference, $V_{ref}$, derived from the Current/Voltage circuit 30. Comparator CMP4 is designed having approximately 0.5 V of hysteresis for noise immunity enhancement. Resistor $R_{vstat}$ is chosen so that the upper load voltage threshold, $V_{up}$, and lower load voltage threshold, $V_{lo}$, are as follows:

$$V_{up} = I5 * R_{vstat} - V_{ref}$$

$$V_{lO} = I5 * R_{vstat} - (V_{ref} + 0.5 \text{ V})$$

When the voltage across the load is less than $V_{lo}$, the voltage at the inverting terminal of comparator CMP4 will be above the non-inverting terminal and the output, which is tied to the VSTATUS pin P26, is low. When the voltage across the load is greater than $V_{up}$, the voltage at the inverting terminal of comparator CMP4 will be less than the non-inverting terminal and the output will be high. Diode Q1 protects ASIC 14 from damage that would result if its voltage rating was exceeded by preventing the voltage at the inverting terminal of comparator CMP4 from going more than one diode drop below GND.

The function of Power Reset circuit 36 is to reset/disable critical sections of the circuitry of ASIC 14 until sufficient operating voltage is present across VS1 (pin P21) and GND (pin P23) for proper operation.

Since the current mirror PNP transistor Q9, current mirror collector resistor R29, the two NPN transistors Q7 and Q8, and the base resistor R5 for output signal MP are duplicated for each of the other output signals CMD, TRP, STS and LAT only the details of the operation of the MP output signal will be described.

Circuit 36 functions such that current flows in the common base PNP current mirrors made up of Q2, Q3, R3 and R6 before any other current sources within ASIC 14. When the collector voltage of transistor Q4 is less than the NPN zener diode of Q6 ($V_q6 = 6.8$ V) connected to the collector of Q4, plus one diode voltage drop of diode Q5 ($V_q5 = 0.7$ V) added for temperature compensation (equivalently $V_q6 + V_q5 = 7.5$ V), there is no Q4 collector current and, therefore, no base current is available for transistor Q7 which is pulled low by base resistor R5 and common resistor R4, so that transistor Q7 is off and transistor Q8 is on (collector-emitter is saturated due to base current supplied by the portion of the current mirror made-up of transistor Q9 and resistor R29). With output signal MP at the saturation voltage of transistor Q8, the MOSFET Protection circuit 42, to be described infra, will be disabled since all current from resistor $R_{mv}$ (pin P48) is shorted to ground GND by transistor Q8.

When the collector voltage of transistor Q4 is greater than $V_q6 + V_q5$, current from the collector of Q4 will flow into the base of transistor Q7 causing the collector-emitter of Q7 to saturate and turning off transistor Q8 (open collector) causing transistor Q8 to have no effect on the operation of MOSFET Protection circuit 42. The collector voltage of transistor Q4 will be equal $V_q6 + V_q5$ when VS1 is approximately one additional diode drop higher (8.2 V total).

The function of Opto-Isolator Drive section 38 is to provide a means of re-routing the main current sources, which supply the majority of ASIC 14, through the LED portion of the trip T and status S opto-isolators when required. Circuit section 38 also establishes a voltage supply VS2 from which most of the components within ASIC 14 are powered.

Voltage source VS2 is established by the zener voltage of NPN transistor Q10 (6.8 V) plus a forward biased diode drop of NPN transistor Q11 (0.7 V) added for temperature compensation for a total of approximately 7.5 V.

The operation of the status opto-drive and the trip opto-drive is identical and therefore only the details of the status opto-drive will be described.

When the input of inverter INV4 is low indicating current flow or load voltage below the thresholds, the output of inverter INV4 is high (open collector). Band gap current source I6 (200u A) will saturate transistor Q14 whose collector is tied to band gap current source I7 (2 m A). The Q14 collector current, current I7, and the base current, I6, will flow into VS2 to power a majority of the ASIC 14 electronics.

When the input of inverter INV4 is high, the output of the inverter will be low sinking all of the current from current source I6 causing a zener breakdown of zener diode Q12 which pulls the base of transistor Q14 approximately one diode drop below the emitter turning Q14 off. With transistor Q14 off, current source I7 will flow through the LED portion of the status opto-isolator S (pin P19) and flow through pin P20 into VS2 to provide power for a majority of the ASIC 14 electronics and indicate current flow or load voltage above the thresholds.

The function of MOSFET Drive and Current Limiting circuit section 40 is to control the MOSFETs drain-source resistance by manipulating the MOSFETs gate-source voltage. The MOSFET control functions are designed to turn the MOSFETs on and off and to limit the peak current flow through the MOSFETs to a calibrated or selected level. Limiting the current prevents over-current conditions from damaging the MOSFETs.

A plurality of MOSFETs PS1–PS7, 7 being indicated in the figure, have their sources and drains connected in parallel with their gates connected respectively to 600 ohm gate resistors R8–R14. Resistors R8–R14, along with another 600 ohm resistor R15 connected to externally mounted capacitor $C_T$ through pin P38 (if required, an eighth MOSFET and a 15 V zener diode can be substituted for $C_I$ at P38), are connected to the junction between current sources I12 and I11 and to pin P47. Current sources I12 and I11 are connected between source VS1 and ground with current source I10 connected between VS1 and the output of op-amp OP1 whose output is adapted to control the state of energization of source I11.

When the ENABLE of op-amp OP1 is low the output of the comparator is pulled high by the band gap current source I10 of 100u A turning on band gap current source I11 of 2.2 m A. Band gap current source I12 sources 600u A and current source I11 sinks 2.2 m A with a net of 1.6 m A flowing from the MOSFET gates and capacitor $C_T$ through the 600 ohm resistor R8 through R15, discharging the MOSFET gates and capacitor $C_T$. When completely discharged the voltage at the negative terminal of source I11, also the positive terminal of source I12, will be approximately one diode drop above ground GND. Since the gates are completely discharged, there will be no current flow through resistors R8 and R15, therefore, the voltage at the MOSFET gates will also be approximately one diode drop above ground GND ensuring that the MOSFETs are off, i.e., their drain-source regions in a state having high impedance. ASIC 14 includes outputs to drive eight MOSFETs directly, that is the gate of eight MOSFETs can be tied directly to outputs of resistors R8 through R15. If additional MOSFETs are desired output CG and external gate resistors are required. Output CG, pin P47, is connected to capacitor $C_{comp}$ and then through pin P45 to the non-inverting terminal of op-amp OP1.

When the ENABLE of op-amp OP1 is high and the non-inverting terminal of OP1, which is tied to the shunt resistor $R_s$ through 600 ohms resistor R19, is lower than the inverting terminal of OP1, the current limiting voltage, the output of op-amp OP1 is low diverting all the current from the 100u A source I10 into the output of OP1 and away from the input of current source I11. This causes current source I11, a 22 times multiplying current source, to be turned off. 600u A from source I12 flows to charge the gates of the MOSFETs turning the MOSFETs on (low drain-source resistance). When the gates are completely charged, there will be no current flow through resistors R8–R15, therefore, the voltage of the MOSFET gates will be approximately one diode drop below VS1 ensuring that the MOSFETs are on. External 15 V zener diode Z1 through Z7 are connected between the MOSFET gates and the sources to protect the MOSFETs from damage due to excessive gate-source voltage. Typical MOSFETs have a maximum gate-source voltage rating of 20 V.

If a load current flows that would cause the voltage drop across shunt resistor $R_s$ (non-inverting terminal of OP1) to exceed the current limit voltage (inverting terminal of OP1) the output of OP1 will begin to come out of saturation causing some of the 100u A from current source I10 to be diverted into the input of current source I11, causing it to turn on. It should be noted that the output voltage of OP1 has a linear effect on the value of current source I11. For example, OP1 output=0 V, I11=0 m A; OP1 output=VS2/2, I11=1.1 m A; OP1 output=VS2, I11=2.2 m A. As the output of OP1 goes positive turning on I11 current flow from I12 will be diverted away from the MOSFET gates to current source I11. Additional current will also be drawn out of the MOSFET gates to I11 such that the gate-source voltage of the MOSFETs will be lowered causing the source-drain resistance to increase, in turn lowering the load current and voltage across the shunt $R_s$. A balanced, steady state condition is reached when the voltage developed across shunt $R_s$ (non-inverting terminal of OP1) is equal to the current limiting voltage (inverting terminal of OP1).

A load current exceeding the current limit level may occur at two different times. First, the controller may turn on into the load current, in which case the circuit will limit the load current to the current limit level during turn on. Second, an overload current may be applied to the controller while it is fully on, i.e, with the MOSFETs drain-source at low resistance. In this case a large degree of current overshoot will occur while the circuit lowers the MOSFETs gate-source voltage to raise the drain-source resistance. In order to limit this peak overshoot and decrease the overshoot duration, NPN transistor Q16 and emitter resistor R16 are connected between the MOSFET gates and ground with its base tied to the shunt $R_s$ through diode connected NPN transistors Q17, Q18. If the voltage across the shunt exceeds a level equal to approximately three forward biased diode drops, i.e., approximately 2.1 V, base current will flow into transistor Q16 turning the transistor on thereby rapidly removing charge from the MOSFET gates. Once the shunt voltage drops below that level the normal output gate drive circuit made-up of current sources I11 and I12 will take over discharging the MOSFETs gates until the voltage across the shunt equals the current limit voltage.

The inverting terminal of op-amp OP1 is tied to CL1 pin P46. The current limit level percentage is approximately equal to the voltage at CL1 in millivolts when a 100 m V/100% rated current shunt is chosen as described supra. For example, 800 m V at CL1 will cause the circuit to current limit at approximately 800% of rated load. If a shunt having a different resistance is chosen, the current limit percentage set by the voltage at CL1 must be adjusted accordingly. The current limit voltage is set by resistor ratio current source I13 of 30u A, resistors R17 of 7.2K ohms, R18 of 14.4K ohms, $R_{cl}$ and $R_{cl}2$. Resistors $R_{cl}1$ and $R_{cl}2$ are connected externally at pins P44, P43 respectively and make up the emitter resistors of Wilson current mirror Q19, Q20, Q21 with the collector of transistor Q19 and base of transistor Q21 connected to current source I13 and the collector of transistor Q21 connected to the inverting terminal of op-amp OP1 and serially connected resistors R17, R18.

The voltage at CL1 ($V_{cl}1$) is as follows:

$$V_{cl}1 = I13 * (R17 + R18) * R_{cl}2/R_{cl}1$$
$$= 30u\,A * (7.2k\ ohms + 14.4K\ ohms) * R_{cl}2/R_{cl}1$$
$$= 648m\,V * R_{cl}2/R_{cl}1$$

Since resistor trimming procedures, such as laser trimming, only increases the value of a resistor as mentioned above, two resistors are required to adjust the voltage at CL1. Increasing the value of $R_{cl}2$ will increase the voltage at CL1 whereas increasing the value of $R_{cl}1$ will decrease the voltage at CL1.

Capacitor $C_t$ is included in the circuit to adjust the turn on and turn off time of the MOSFETs by adjusting the rate of rise and fall of the MOSFETs gate-source voltage. Stabilizing capacitor $C_{comp}$ is connected in the OP1 feedback path to minimize load current oscillations during current limiting.

The junction of resistors R17 and R18 is tied to the inverting terminal of comparator CMP5 whose non-inverting terminal is connected to shunt $R_s$ through resistor R19 and whose output is connected to the Logic circuit section 44 through a line labeled MP ENA. The voltage divider formed by resistors R17 and R18 make the voltage at the inverting terminal of comparator CMP5 (CMP5−) equal to ⅔ of the current limit voltage $V_{cl}1$.

When the voltage across the shunt is less than ⅔ $V_{cl}1$, the output of comparator CMP5 is low. When the voltage across the shunt exceeds ⅔ $V_{cl}1$, the output of the comparator is high. As mentioned above, the output of comparator CMP5 is tied to Logic circuit 44 and is used as one of the signals required to enable the MOSFET Protection Circuit 42 to be discussed below.

Transient suppressors VTR1, VTR2 are added across LINE to LINE GND and LOAD to LINE GND respectively to protect the MOSFETs and certain circuitry from damage due to LINE and LOAD voltage transients and from LOAD voltage transients caused by switching inductive loads.

The function of the MOSFET Protection Circuit 42 is to provide a secondary trip signal that indicates when the MOSFET junction temperature has risen a selected amount due to high levels of power dissipation which can occur during current limiting. The circuit also includes a thermal memory feature to prevent repeated applications of current limiting at intervals which would not allow the MOSFET junction temperature to return to ambient preventing the MOSFETs from exceeding the maximum junction temperature.

During the current limiting procedure the resistance of the MOSFETs drain-source is increased to limit the current to a predetermined level as described above. In effect, the controller and the load form a voltage divider where the voltage across the load is such that only the current limit level is passing through the load and the rest of the line voltage is dropped across the controller's LINE-LOAD terminals. In order to protect the MOSFETs from over heating during current limiting due to the power being dissipated in the MOSFETs, a thermal model of the MOSFET package system encompassing the MOSFETs, packaging materials, and attachment materials, was used to determine the time required for a given power dissipation to raise the junction temperatures of the MOSFETs a selected amount. To approximate the thermal model results, the following first order differential equation was used which models the energy stored in the MOSFETs as a function of time, which is proportional to the temperature rise of the MOSFETs as a function of time:

$$aEmp(t) + d\,Emp(t)/dt = P(t) \qquad (11)$$

Where:
P(t) = the power dissipated in a single MOSFET as a function of time.
a = 1/the thermal time constant of the MOSFET package system.

The solution is as follows:

$$Emp(t) = \int_0^t V(\tau)I(\tau)e^{-a(t-\tau)}d\tau + Emp(t = 0)e^{-at}$$

V(t) = the voltage across the MOSFETs (Vline−Vload) as a function of time.
I(t) = the current through a single MOSFET as a function of time. I(t) = the load current/number of MOSFETs (assuming equal load current through the MOSFETS).
V(t) * I(t) = the power dissipated within a single MOSFET as a function of time.
EMP(t=0)e−at = the thermal memory of the equation where EMP(t=0) is the energy stored in the MOSFET at time=0.

The circuit simulates the temperature of the MOSFETs and trips when the temperature of the MOSFETs has risen the selected amount. The allowable temperature rise is simply the maximum allowable junction temperature of the MOSFET (e.g., 150° C.) minus the maximum operating temperature of the controller (e.g., 80° C.). Circuit portion 42 produces an electrical signal in the form of a voltage that is proportional to the above energy/temperature equation in the manner described below.

Resistor Rmv is connected to LINE and ground GND through serially connected Q22 and R20.

$$imv(t) = (Vline(t) - Vload(t) - VQ22)/(Rmv + R20), \qquad (12)$$

where:
VQ22 is the voltage drop across diode connected transistor Q22.

$$imv(t) = (Vline(t) - Vload(t))/(Rmv + R20) - VQ22/(Rmv + R20)$$

$$imv(t) = V(t)/(Rmv + R20) - VQ22/(Rmv + R20)$$

Transistors Q22, Q23 and resistors R20 and R21 make-up a standard current mirror with emitter resistors to minimize errors due to transistor $V_{be}$ mismatch, making:

$$i5(t) = imv(t)$$

Transistors Q24, Q25, Q26 and resistors R22 and R23 make-up a standard "Wilson" current mirror configuration, providing improved collector current matching by minimizing base current error, with emitter resistors to minimize errors due to transistor $V_{be}$ mismatch, making:

$$i6(t) = i5(t)$$

Current i6(t) flows through diode connected NPN transistor Q28 to charge the parallel R-C network made up of resistor $R_{mp}$ and $C_{mp}$.

The voltage across $R_{mp}$ and $C_{mp}$ is as follows:

$$V_{mp}(t) = \qquad (13)$$

$$1/C_{mp} \int_0^t i6(\tau)e^{-1/(R_{mp}C_{mp})(t-\tau)}d\tau + V_{mp}(t=0)e^{-t/(R_{mp}C_{mp})}$$

It can be seen from the equation for $V_{mp}(t)$ (13) and $E_{mp}(t)$ (12), $V_{mp}(t)$ is proportional to $E_{mp}(t)$ under the following conditions:
$R_{mp} C_{mp} = 1/a$; setting the time constants of the two equations equal to each other.
i6(t) is proportional to V(t) * I(t). This can be seen as follows: i6(t) is approximately proportional to V(t) * I(t) due to the fact that I(t) is a constant during current limiting (let I(t)=I), and, as can be seen in the equation for i6(t), i6(t) is equal to a term proportional to V(t):

$$V(t)/(R_{mv} + R20)$$

minus an error term:

$$VQ22/(R_{mv} + R20)$$

In practice, the error term is partially compensated for through selection of $R_{mv}$, $C_{mp}$ and $R_{mp}$.

Diode Q28 prevents discharge of the $R_{mp}$ and $C_{mp}$ network through other circuitry (i.e., comparator CMP6) preserving thermal memory even in the event power is removed from ASIC 14. Diode connected transistor Q27 tied between the non-inverting terminal of comparator CMP6 and VREF provides compensation for the temperature effect on the voltage drop across diode Q28.

The voltage at the inverting terminal of comparator CMP6 ($V_{cmp}6-$) is equal to:

Vcmp 6— = $V_{mp}(t)$+VQ28, where VQ28 is the voltage drop across diode Q28.

The voltage at the non-inverting terminal of comparator CMP6 ($V_{cmp}6+$) is equal to:

$V_{cmp}6+ = V_{ref}+VQ27$ where VQ27 is the voltage drop across diode Q27. Diode Q27 is forward biased by current source I14.

Assuming that the difference between the voltage drop across diodes VQ27 and VQ28 is negligible, when $V_{mp}(t)$ is less than $V_{ref}$, $V_{cmp}6-$ will be less than $V_{cmp}6+$ and the output of comparator CMP6 will be high signifying that the junction temperature of the MOSFETs has not risen the allowable amount and, therefore, a trip condition is not present. Again, assuming that the difference between the voltage drop across diodes VQ27 and VQ28 is negligible, when $V_{mp}(t)$ is greater than $V_{ref}$, $V_{cmp}6-$ will be greater than $V_{cmp}6+$ and the output of the comparator will be low signifying that the junction temperature of the MOSFETs has risen the allowable amount and, therefore, a trip condition is present.

When MP is low (i.e., saturated transistors output of inverter INV1 of logic circuit 44 to be discussed below) circuit section 42 is disabled due to the fact that the imv(t) current is diverted through the MP line away from circuit section 42. However, when MP is high (open collector) circuit section 42 operates as described above since none of the imv(t) current will flow into the MP line.

Logic circuit 44 uses the various input signals, i.e., MP ENA, MP TRIP, I²RC TRIP and the $C_{com}$ input from ASIC 12, and provides appropriate output signals, i.e., CMD, MP and TRP, required to coordinate the operation of the other functional circuit sections of ASIC 14. Logic circuit 44 also provides a trip latch feature in which a latch sets upon a trip indication, turning the controller off, and remains set until a reset signal is applied.

As stated supra, the $C_{com}$ input is the only operator controllable input signal driven by the supply ASIC 12. The $C_{com}$ input has the following three functions:

1) $C_{com}$=High (open collector of photo-transistor); controller off
2) $C_{com}$=High; controller reset after trip
3) $C_{com}$=Low (photo-transistor saturation voltage); controller on The $C_{com}$ signal, along with band gap current source I1 is tied to the inverting input of comparator CMP1 with the non-inverting input connected to $V_{ref}$. Comparator CMP1 has approximately 0.5 V hysteresis designed into it so that the lower threshold is $V_{ref}$ and the upper threshold is $V_{ref}+0.5$. The collector of phototransistor C is tied to the $C_{com}$ pin P17. When the LED portion of the opto-isolator is off, no collector current flows through the photo-transistor and the inverting terminal of comparator CMP1 is pulled up by current source I1 to approximately one diode drop below VS2. When the voltage at the inverting terminal of comparator CMP1 is higher than the upper voltage threshold at the non-inverting terminal ($V_{ref}+0.5$ V), the output of comparator CMP1 is low. When the LED portion of the opto-isolator is on, the photo-transistor is saturated with a collector current of 150 u A pulling the inverting input of comparator CMP1 below the lower threshold voltage of the non-inverting input ($V_{ref}$) and forcing the output of CMP1 high. The output of CMP1 is tied to the B input of gate NAND 2 and the A input of gate NAND 3.

Capacitor Clat is tied to the positive terminal of band gap current source I2, the negative terminal of band gap current source I3 and the inverting terminal of comparator CMP2. When the output of gate NAND 4 is low, current source I2 is off and source I3 discharges capacitor Clat pulling it to approximately one diode voltage drop above GND. When the voltage at capacitor Clat, the inverting terminal of comparator CMP2, falls below the voltage at the non-inverting terminal ($V_{ref}$) the output of comparator CMP2 goes high. When the output of gate NAND 4 is high, current source I2 is on and a net current of I2-I3 charges capacitor Clat pulling it to approximately one voltage drop below VS2. When the voltage at capacitor Clat, the inverting terminal of comparator CMP2, rises above the voltage at the non-inverting terminal ($V_{ref}$), the output of comparator CMP2 goes low. Since capacitor Clat is being charged and discharged by constant current sources, the delta time (dT) required to cause a delta change of the voltage (dV) across capacitor Clat is as follows:

gate NAND 4 output=low (Clat discharge):

$$dT=Clat * dV/I3$$

gate NAND 4 output=high (Clat charge):

$$dT=Clat * dV/(I2-I3)$$

If the voltage across capacitor Clat is fully discharged to one diode drop above GND (0.7 V), the time required to raise the voltage to $V_{ref}$(3.25 V) when the output of gate NAND 4 goes high is as follows:
$$dT=Clat * (3.25\ V-0.7\ V)/(50u\ A-5u\ A).$$

With a typical value of Clat in a 28VDC controller of 0 0027u F;

$$dT=0.0027u\ F * (3.25\ V-0.7\ V)/(50u\ A-5u\ A)=153\ u\ S.$$

If the voltage across capacitor Clat is fully charged to one voltage drop below VS2 (6.8 V), the time required to discharge capacitor Clat to $V_{ref}$ when the output of gate NAND 4 goes low is as follows:

$$dT=Clat * (6.8\ V-3.25\ V)/5\ u\ A$$

$$dT=0.0027\ u\ F * (6.8\ V-3.25\ V)/5\ u\ A=1.917\ m\ S.$$

Thus the set and reset time delay of the trip latch within logic circuit 44 is provided by externally mounted capacitor Clat. The set and reset time delay enhances noise immunity by making any noise spikes of a duration less than the set and reset time delays unable to change the state of the trip latch.

In the off state the inverting terminal of comparator CMP1 is pulled high by current I1 so that the output of CMP1 and inputs B of gate NAND 2 and A of gate NAND 3 are low. This results in a high output of NAND2 and NAND 3. With regard to NAND 2 the output of inverter INV2 will be low. This is tied to the ENABLE of op-amp OP1 and the controller is off.

With regard to gate NAND 3, since the controller is in the off state the outputs of comparator CMP7 of the I²RC section 32 (I²RC TRIP) and comparator CMP6 of the MOSFET Protection section 42 (MP TRIP) are high representing a no trip condition, so the output of NAND 4 is low with current source I2 off. Current source I3 pulls the inverting terminal of comparator CMP2 to one diode drop above ground making the output of CMP2 high and the output of inverter INV3 low. The INV3 output is tied to the opto-isolator drive section 38 TRP line with the low signifying that there is no trip signal to be sent to Supply ASIC 12. The output of inverter INV3 is also tied to input B of NAND 3.

The output of comparator CMP2 (high) is also tied to the A inputs of NAND 1 and NAND 2. The input B of NAND 2, as stated above, is low so that input A has no effect in this state. With respect to gate NAND 1, since the controller is off no voltage is developed across the shunt so that the output of comparator CMP5 is low. The output of NAND 1 then is high which is inverted to low through INV1 with the result that the MOSFET Protection section 42 is disabled.

In the off state the latch is reset, the MOSFET Drive and Current Limiting section is turned off, the TRIP signal is low and the MOSFET Protection section is disabled.

There are two distinct states when the controller is turned on, the first with load current less than two thirds of the current limit level and the second with the load current greater than two thirds of the current limit level. The MOSFET Protection section is enabled only when the load current is greater than two thirds of the current limit level in order to avoid the possibility of nuisance tripping while the MOSFETs are turning on.

When the controller is turned on, the output of comparator CMP1 goes high so that inputs B of NAND 2 and A of NAND 3 are high. With respect to NAND 2 since, as stated above, the input A of NAND 2 is high, the output goes to low which is inverted to high by inverter INV2 thereby enabling op-amp OP1 turning on the controller.

With respect to NAND 3, since input A is high and since its input B is low, as stated in the description of the off state, it remains with a high output.

Looking at the inputs of NAND 1 since nothing in the latch section changed state, i.e., the output of comparator CMP2 remains high, if the controller is conducting current below the two thirds threshold the output of comparator CMP5 is low along with the input B of NAND 1. The output of NAND 1 is high which is inverted to low by INV1 which results in the MOSFET Protection section being disabled. If the controller is conducting current above the two thirds threshold the output of comparator CMP5 is high along with input B of NAND 1. The output of NAND 1 will then be low which is inverted to high by INV1 and thereby the MOSFET Protection Circuit 42 is enabled.

As stated above, turning the controller on puts a high on input A of NAND 3. When no trip condition occurs the inputs A, B and C of NAND 4 are all high. If a trip occurs then one of inputs A and C of NAND 4 will turn to a low and the output of NAND 4 will go high. This turns on current source I2, to charge capacitor Clat. When Clat gets above $V_{ref}$ the output of comparator CMP2 goes low. The output of comparator CMP2 is tied to inputs A of NAND 1 and NAND 2 which turns the outputs of both gates to a high which are inverted to low by inverters INV1 and INV2 respectively. When the output of inverter INV2 goes low the controller shuts off and when the output of inverter INV1 goes low the MOSFET Protection section is disabled.

When the output of comparator CMP2 turns low the output of inverter INV3 goes high thereby turning on the LED portion of the trip opto-isolator T, through the Opto-Isolator Drive section, sending the trip signal to Supply ASIC 12. That same high is fed back to input B of NAND 3 forcing the output to go low which sets the latch. With the controller turned off due to a trip condition the previous trip signal at either of inputs A and C of NAND 4 can be removed but the controller will remain latched off because of the low on input B of NAND 4.

In order to reset the controller, the output of CMP must change to a low via the $C_{com}$ input which will put the input A of NAND 3 low turning the input B of NAND 4 high. Provided both the $I^2RC$ TRIP and MP TRIP signals have returned to high states signifying no trip condition present, the output of NAND 4 will go low resetting the latch.

As described above, the solid state power controller provides means for controlling load current through an isolated, solid state, high side switch (turn on and off), through a COMMAND input line. The controller provides a means for tripping in accordance with a specified trip time vs load current curve, for limiting current flow through the load and for protecting the solid state switch from damage due to excessive power dissipation during current limiting. Trip conditions are latched keeping the controller off until a reset signal is applied through the COMMAND input line. The controller also provides a STATUS output reflecting load voltage or current and trip output signals giving an indication of the state of the controller and the load.

The COMMAND, STATUS and TRIP signals operate in accordance with the truth table shown in Table 1 in which 1=TTL High and 0=TTL low.

TABLE 1

| COMMAND | STATUS | TRIP | CONTROLLER CONDITION |
|---|---|---|---|
| 0 | 0 | 0 | Controller off/reset |
| 1 | 0 | 0 | Controller on, load current/voltage below circuit threshold |
| 1 | 1 | 0 | Controller on, load current/voltage above circuit threshold |
| 1 | 0 | 1 | Controller tripped |

Controllers made in accordance with the invention containing solid state sensors and switches coupled with integrated circuit logic can be conveniently disposed in a sealed package and can be remotely mounted near the load they are protecting resulting in significant reduced power line cable weight and bulk. The solid state components significantly increase switching life as compared to conventional circuit breakers. Also, such controllers provide a means for switching high voltage DC, due to the availability of high voltage solid state switch components, not available using mechanical approaches. Such controllers can provide computer controlled load switching while maintaining current overload protection, i.e., they follow selected trip time vs load current curves such as the standard MS3320 trip time vs load current relationships thereby enabling optimization of wire size and current rating. The STATUS and TRIP feedback allows continuous monitoring, e.g., via a computer, of each controller circuit. The STATUS can be configured to monitor voltage at the load output terminal or current flow through the controller.

A controller made in accordance with the invention also provides current limiting and power switch protection. During a high level overload, e.g., a short circuit, the controller limits the circuit current to a preset level and maintains it, tripping only when the power switch junction temperature has risen the selected amount thereby avoiding premature tripping due to momentary transients.

Though the invention has been described with respect to a specific preferred embodiment thereof, many variations and modifications will immediately become apparent to those skilled in the art. For example, it is within the purview of the invention to employ P-channel technology for the MOSFETs as well as the N-channel described above. Although MOSFETs are described as the power switches it is also within the purview of the invention to use IGBTs, insulated gate bipolar junction transistors which have certain advantages in high current applications. It is therefore the intention that the appended claims be interpreted as broadly as possible in view of the prior art to include all such variations and modifications.

We claim:

1. Apparatus comprising:
   solid state switch means adapted to be connected to a line connected to a load,
   a first current path comprising a first resistor connected to the line,
   a second current path coupled to the first current path through a first current mirror, the current mirror including a second resistor in the first current path and a third resistor in the second current path,
   a third current path coupled to the second current path through a second current mirror, the current mirror including a fourth resistor in the second current path and a fifth resistor in the third current path,
   a solid state switch means protection RC network, the third current path coupled to the protection RC network to charge the network which is adapted to provide a voltage representative of the temperature rise of the solid state switch means,
   voltage responsive means having a threshold level coupled to the RC network for comparing the voltage across the network to a reference voltage to provide a trip signal when the voltage across the network reaches the threshold level, and
   means to turn off the solid state switch means in response to the trip signal.

2. Apparatus according to claim 1 including means to selectively divert current from the first path to disable the apparatus.

3. Apparatus according to claim 1 in which the solid state switch means comprises at least one MOSFET.

4. Apparatus according to claim 1 further including thermal memory means in which the voltage across the RC network is maintained when the solid state switch means is turned off in proportion to the cooling of the solid state switch means.

5. Apparatus according to claim 4 in which the thermal memory means comprises a diode connected to allow selected decay of the RC network voltage.

6. Apparatus according to claim 5 in which the trip signal is produced approximately in accordance with the following relationship:

$$V_{mp}(t) =$$

-continued $$1/C_{mp} \int_0^t i6(\tau)e^{-1/(R_{mp}C_{mp})(t-\tau)} * d\tau + V_{mp}(t=0)e^{-t/(R_{mp}C_{mp})}$$

where
   $C_{mp}$ is the capacitor of the RC network
   $R_{mp}$ is the resistor of the RC network
   $i6 = (V_{line} - (V_{load}(t) + V_{Q22}))/(R_{mv} + R_{20})$
   $R_{mv}$ = the first resistor
   $R_{20}$ = the second resistor
   $Q_{22}$ = the diode connected transistor.

7. Apparatus for protecting a solid state switch means from thermal damage due to power dissipation comprising:
   solid state switch means having a junction serially connected to a load,
   means to limit current flow through the solid state switch means to a selected value while still maintaining current flow to the load,
   means for generating a current proportional to the power dissipated in the solid state switch means,
   means for integrating the current proportional as a function of time providing an electrical signal proportional to the temperature rise of the junction of the solid state switch means, and
   means for providing a trip signal when a preselected temperature rise of the junction has been reached.

8. Apparatus according to claim 7 in which the means for integrating the current proportional comprises an RC network.

9. Apparatus according to claim 8 further including thermal memory means in which the voltage across the RC network is allowed to decay naturally in proportion to the cooling of the junction of the solid state switch means when the solid state switch means is turned off.

10. Apparatus according to claim 9 in which the solid state switch means comprises at least one MOSFET.

11. A solid state controller for controlling load current through a wire to a load comprising:
   solid state switch means serially connectable to a load through a wire,
   a shunt resistor serially connected to the switch means and the wire,
   means for developing a first electrical signal proportional to the temperature rise of the wire and for providing a first trip signal when the electrical signal proportional to the temperature rise of the wire reaches a selected level,
   means to limit current flow through the solid state switch means to a selected value while still maintaining current flow to the load,
   means for developing a second electrical signal proportional to the power being dissipated in the solid state switch means, integrating the second electrical signal to produce a third electrical signal proportional to the temperature rise of the switch means, and for providing a second trip signal when the third electrical signal reaches a selected level representing a selected temperature rise, and
   means for turning off the solid state switch means when either first or second trip signal is produced.

12. A solid state controller comprising ground, line and load terminals, solid state power switch means having a resistance connected to conduct current from the line terminal to the load terminal, means for modulating the resistance of the power switch means to limit current through the power switch means to a selected maximum level while still maintaining current flow to the load terminal, a first current path means comprising a resistor connected to the line terminal for producing a current proportional to the line to load voltage, an RC network means charged by the said current proportional to the line to load voltage, and comparator means having a threshold to compare the voltage across the RC network means with a reference voltage indicative of the maximum allowable temperature rise of the power switch means and to produce an electrical signal when the voltage across the RC network means reaches the threshold level.

13. A solid state controller according to claim 12 in which the power switch means comprises at least one MOSFET.

14. A solid state controller according to claim 12 further including a diode connected to the RC network means to allow selected decay of the RC network means voltage thereby providing thermal memory of the temperature rise of the solid state power switch means.

15. A solid state controller for controlling load current through a wire to a load according to claim 11 further including means to enable the said means for developing a second electrical signal only when the load current is greater than a selected current limit level.

16. A solid state controller for controlling load current through a wire to a load according to claim 15 in which the selected level is two-thirds of the current limit level.

* * * * *